(12) United States Patent
Pape

(10) Patent No.: US 6,215,171 B1
(45) Date of Patent: Apr. 10, 2001

(54) IC MODULE

(75) Inventor: Heinz Pape, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/477,443

(22) Filed: Jan. 4, 2000

Related U.S. Application Data

(63) Continuation of application No. PCT/DE98/01850, filed on Jul. 3, 1998.

(30) Foreign Application Priority Data

Jul. 4, 1997 (DE) ............................................. 197 28 692

(51) Int. Cl.$^7$ ................................................. H01L 29/00
(52) U.S. Cl. .......................... 257/532; 257/532; 257/535; 257/690
(58) Field of Search ...................... 257/532, 535, 257/924, 700, 690, 728

(56) References Cited

U.S. PATENT DOCUMENTS

| | | | |
|---|---|---|---|
| 4,994,936 | * 2/1991 | Hernadez | 361/306 |
| 5,049,979 | 9/1991 | Hashemi et al. . | |
| 5,134,539 | * 7/1992 | Tuckerman et al. . | |
| 5,208,725 | * 5/1993 | Akcasu | 361/313 |
| 5,428,885 | 7/1995 | Takaya et al. . | |
| 5,633,785 | 5/1997 | Parker et al. . | |
| 5,818,106 | * 10/1998 | Kunimatsu | 257/703 |
| 5,834,832 | * 11/1998 | Kweon et al. | 257/676 |
| 5,973,390 | * 10/1999 | Arnaya et al. | 257/678 |
| 5,982,018 | * 11/1999 | Wark et al. | 257/532 |
| 6,005,778 | * 12/1999 | Spielberger et al. | 257/686 |
| 6,054,754 | * 4/2000 | Bissey | 257/666 |

FOREIGN PATENT DOCUMENTS

| | | |
|---|---|---|
| 42 42 097 A1 | 6/1994 | (DE) . |
| 0 716 449 A2 | 6/1996 | (EP) . |

\* cited by examiner

Primary Examiner—Eddie C. Lee
Assistant Examiner—Lourdes Cruz
(74) Attorney, Agent, or Firm—Herbert L. Lerner; Laurence A. Greenberg; Werner H. Stemer

(57) ABSTRACT

An IC module has one or more integrated circuits and a package surrounding them. The IC module is distinguished by one or more additional electronic components being accommodated inside the package, in the immediate vicinity of the integrated circuit.

7 Claims, 2 Drawing Sheets

IC MODULE

CROSS-REFERENCE TO RELATED APPLICATION

This application is a continuation of copending International Application No. PCT/DE98/01850, filed Jul. 3, 1998, which designated the United States.

BACKGROUND OF THE INVENTION

Field of the Invention

The present invention relates to an IC module having one or more integrated circuits and a package surrounding them.

Innumerable versions of such IC modules have been known for many years, and require no further explanation.

It is also known that, in some cases, when operating integrated circuits, effects occur which can interfere with operation of the relevant integrated circuit and/or of integrated circuits located in the vicinity thereof, unless appropriate countermeasures are taken.

One such effect can be observed, for example, during switching processes in driver stages of the type shown in FIG. 4, which will be discussed in detail below. Such circuits cannot be used easily and cause problems, especially at very high frequencies and operating speeds.

SUMMARY OF THE INVENTION

It is accordingly an object of the invention to provide an IC module, which overcomes the hereinafore-mentioned disadvantages of the heretofore-known devices of this general type in such a way that it can be used easily and without any problems even at very high frequencies and operating speeds.

With the foregoing and other objects in view there is provided, in accordance with the invention, an IC module, comprising at least one integrated circuit; a base in the form of a platelet disposed on the at least one integrated circuit, the base formed of a material selected from the group consisting of glass and ceramic; a passive component carried by the base; and a package jointly surrounding the component and the base.

The invention accordingly provides that one or more additional electronic components are accommodated on a base, inside the package of the IC module, in the immediate vicinity of the integrated circuit and that the base is a glass or ceramic platelet.

In consequence, electronic components which are required for the integrated circuit to operate and behave correctly can be disposed in the immediate vicinity of those points at which the effects to be avoided or to be compensated for are initiated or occur.

Therefore, inter alia, the back-up capacitors can also be disposed in the immediate vicinity of those points at which the previously described short-circuits occur.

Fitting the back-up capacitors in the immediate vicinity of these points has the positive effect of permitting the charges stored in the back-up capacitors to be made available essentially immediately, and to be replaced essentially without any delay, virtually irrespective of the signal frequencies and the operating speed. This means that, in any case if the back-up capacitors are constructed to be sufficiently large, it is not possible for any brief supply voltage collapses to occur.

An IC module has thus been found which can be used without any problems even at very high frequencies and operating speeds.

In accordance with another feature of the invention, the passive components are produced as co-fired ceramic and formed on the base.

In accordance with a further feature of the invention, there is provided a capacitor area formed on the base, the capacitor area including a multiplicity of capacitors. In accordance with an added feature of the invention, at least some of the capacitors in the capacitor area have a common substrate electrode or cover electrode.

In accordance with an added feature of the invention, the base is bonded to the integrated circuit. In accordance with an additional feature of the invention, bond pads are disposed on the base, and the passive components are disposed on the base and are to be connected to the integrated circuit by the bond pads. In accordance with yet another feature of the invention, the base has an edge at which the bond pads are disposed. In accordance with a concomitant feature of the invention, there are provided bonding wires connected to the bond pads and meeting the bond pads relatively flat.

Other features which are considered as characteristic for the invention are set forth in the appended claims.

Although the invention is illustrated and described herein as embodied in an IC module nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
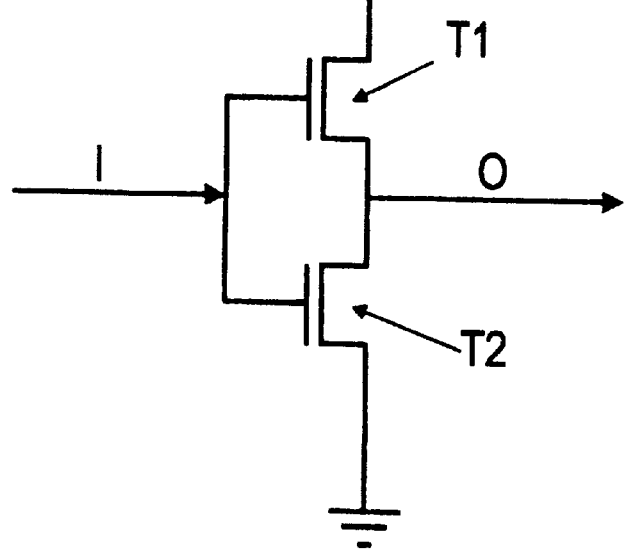
FIG. 4 is a schematic circuit diagram which illustrates a structure of a driver stage that is normally used in integrated circuits.

Referring now to the figures of the drawings in detail and first, particularly, to FIG. 4 thereof, there is seen a driver stage which includes two MOS transistors T1 and T2, that are connected as shown. One of the transistors is always assumed to be switched on, while the other is always switched off, so that an output signal O from the driver stage is always either at the potential of a positive supply voltage connection (VDD) or the potential of a negative supply voltage connection (ground), depending on an input signal I.

The MOS transistors used in such driver stages have the characteristic of being able to be changed somewhat faster from the switched-off state to the switched-on state than vice versa. It is thus possible for both transistors to be switched on for a short time during transistor switching processes initiated by the input signal I. If and for as long as both transistors are switched on, there is a short-circuit between VDD and ground. In consequence, a current flows which is so high that the supply voltage VDD briefly collapses. That supply voltage collapse interferes with adjacent circuit parts of the integrated circuit because it can lead to inadvertent switching processes there. Amplifying circuit parts can further exacerbate those effects.

Capacitors which are called back-up capacitors are introduced between VDD and ground for compensation or suppression. Those back-up capacitors which cannot be integrated into the integrated circuit, at least without further actions, and are therefore provided outside the IC module, act as a charge buffer and consequently make it possible for those charges which flow away to a very major extent during the short-circuit to be provided and/or to be replaced quickly to a sufficient extent. In consequence, the short circuit (which is still present as before) loses some of its negative effects. Therefore, the previously mentioned major voltage collapse can be entirely or partially prevented.

On one hand, the higher the frequency of the signals which have to be processed or produced by an integrated circuit, and the higher the speed at which an integrated circuit operates, the less effective are suppression measures such as the back-up capacitors. However, on the other hand, since ever-higher signal frequencies and operating speeds are required and are being implemented, it is becoming more and more difficult to use IC modules for such applications.

An IC module which will be described in more detail in the following text is any desired IC module, having a construction, function and size that are not subject to any limitations at all. It may even be a so-called multichip module, in which a number of integrated circuits are combined in one IC module (for example disposed alongside one another on a so-called multichip module substrate which is used as a common base).

The described IC modules are distinguished in that they contain additional electronic components, apart from one or more integrated circuits.

The components in the example which is considered in more detail in the present text are the back-up capacitors, which have already been mentioned in the introduction, that are used to compensate for the short-circuits which occur, for example, in configurations shown in FIG. 4. However, as will be described in much more detail later, there is no limitation thereto. The components may in principle be components and structures of any desired type, intended for any desired purposes.

The back-up capacitors are disposed on a base in the form of a platelet which is connected, preferably by bonding, to the integrated circuit for which the back-up capacitors are intended.

Figure 1:
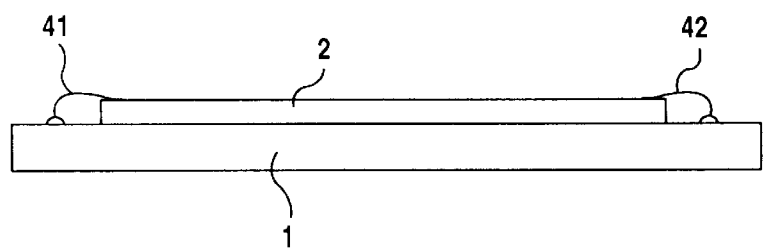
FIG. 1 is a diagrammatic, side-elevational view of an integrated circuit having a (component) base disposed thereabove.

Such a configuration is shown in FIG. 1. FIG. 1 shows an integrated circuit 1 onto which a base or carrier 2 is bonded.

The base 2 is in the form of a platelet and is fitted with one or more capacitors, which are not shown in FIG. 1. A package or housing 4 surrounds the base 2.

The base 2 in the form of a platelet is preferably a ceramic or glass platelet. Ceramics and glasses are highly suitable for use as a base material since, on one hand, they are matched or can be matched relatively well thermomechanically to silicon and other semiconductor materials for producing integrated circuits 1 and, on the other hand, due to their high dielectric constants, they are ideally suited to the formation of capacitors on the base 2.

In the example under consideration, one or more capacitors are provided on the base 2, and their electrical connections are in the form of bond pads, each of which may be constructed for one or more bonded connections. The components which are provided or formed on the base 2 can be electrically connected through these bond pads (which are not shown in FIG. 1) and through bonding wires 41, 42 to integrated circuits which are located underneath, or other integrated circuits (for example in the case of multichip modules) in the IC module under consideration.

The base 2, with the capacitor or capacitors located thereon, may, for example, be produced as a so-called co-fired ceramic.

In this technology, which is also normally used to manufacture known SMD ceramic capacitors, metal coatings (for example Cu, Ag, W or the like) are applied in a first step onto thin "green tape" ceramic substrates which can still be cut, stamped and formed, in which case items are applied, for example, by printing. The coated substrates are then cut to size, are joined together to form stacks and are fired. Single-layer capacitors can, of course, also be produced.

The capacitors may also be mounted on the base 2 using thick-film technology, in which case dielectric and metallic layers are applied (generally as pastes using the screen-printing method) to ready-fired ceramic substrates, and are burnt in or are sintered together.

The methods described above are known and are economic.

Thin-film capacitors or other structures using thin-film technology are also feasible in principle. In that case dielectric and metallic layers are applied to the substrate (ceramic, glass, metal or organic material such as the polyimide used to cover chips), for example by centrifuging, curing, vapor-deposition etc., and are structured through the use of photographic structuring and etching processes, in a similar way to that used in the production of semiconductor chips.

Thin-film technology can be used more flexibly and provides higher-precision results but, for this purpose, is also more expensive than the techniques described above.

Feasible types of configuration and placement of one or more back-up capacitors on a base 2 will be described in the following text, in particular with reference to FIGS. 2A, 2B and 3.

The back-up capacitor which is shown in the figures is a thick-film capacitor produced by using thick-film technology. However, the following statements apply to components produced by using other methods as well, except where they relate to individual special features of thick-film technology.

Figure 2A:
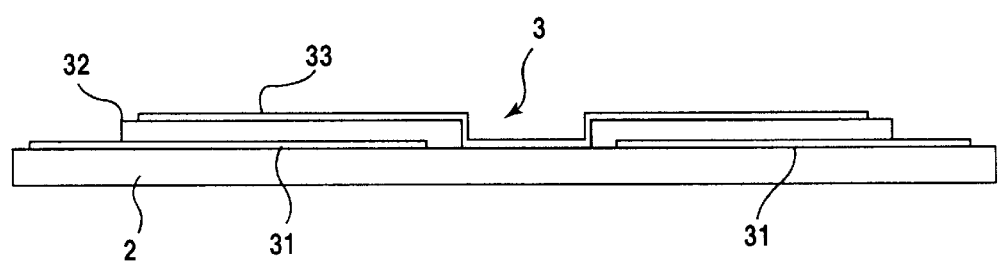
FIG. 2A is a side-elevational view of the base shown in FIG. 1, having a capacitor formed thereon.
Figure 2B:
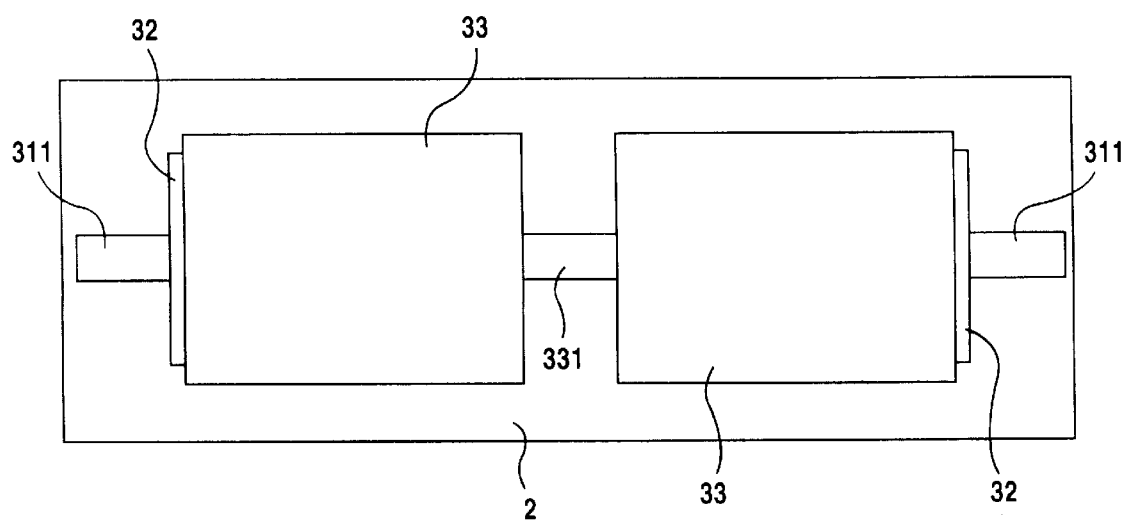
FIG. 2B is a plan view of the base shown in FIG. 2A.

The fundamental structure of the back-up capacitor is shown in FIGS. 2A and 2B, with FIG. 2A showing a side view of the base containing the capacitor, and FIG. 2B showing a plan view of the same base.

The capacitor, which is denoted by reference symbol 3, includes a substrate electrode 31 mounted on the base 2, a dielectric layer 32 applied (with a thickness of 50 $\mu$m in the example under consideration) to the substrate electrode 31, and a cover electrode 33 mounted above the dielectric layer 32.

The capacitances of capacitors that are formed (in a single layer) in such a way depend primarily on the material used to produce the dielectric layer 32. Two examples are quoted as being representative in the following table:

| Dielectric material | Relative dielectric constant | Electrode material | Capacitance per unit area in pF/mm$^2$ |
|---|---|---|---|
| Crystalline glass | 150 | Ag/Pd | 30 |
| Lead-perovskite (PbTiO$_3$) | 3000 | Au | 500 |

Capacitances of 20 pF are frequently sufficient for back-up capacitors. Thus, even with a single-layer glass structure, a capacitor area of 1 mm$^2$ per driver circuit as shown in FIG. 4 would actually be more than sufficient. With skilful construction, even large connecting surfaces (bond pads), that is to say those constructed for the connection of a number of bonding wires, can be accommodated on this area.

As can be seen in particular from FIG. 2B, the bond pads are formed by sections 311 and 331 of the substrate electrode 31 and the cover electrode 33 which projects over the dielectric layer 32.

The components disposed on the base 2 are connected through the bond pads to the integrated circuit on which they are located, or to a multichip module substrate on which there are a number of integrated circuits.

As has already been mentioned above, each of the bond pads may be constructed for connection to a plurality of bonding wires. However, this need not necessarily be the case, of course.

The bond pads 311 and 331 need not be located on opposite sides of the capacitor area, as in the case of the embodiment shown in FIGS. 2A and 2B. They may also be located alongside one another, on the same side of the capacitor area. FIG. 3 shows a back-up capacitor constructed in this way.

Figure 3:
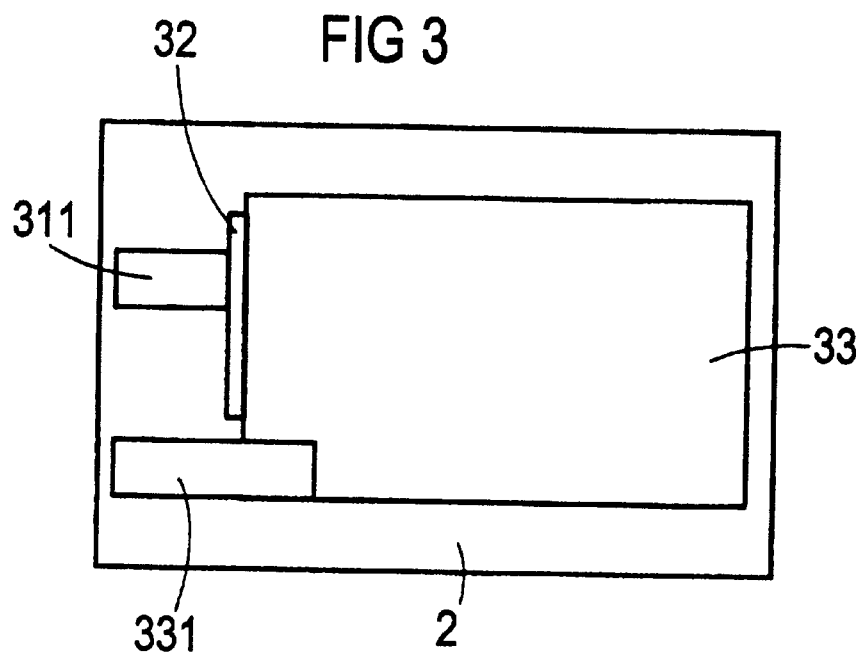
FIG. 3 is a plan view of a capacitor formed in a different way than that in FIGS. 2A and 2B.

A bond pad configuration as shown in FIG. 3 has been found to be advantageous in most cases since, as a result of that configuration, the bond pads of the components provided on a base may be disposed along the edge of the base. This is advantageous since it allows the use of particularly short bonding wires for (direct or indirect, that is to say on a circuitous route over, for example, multichip module substrates or lead frames) connection of the components on the base 2 to the integrated circuit located underneath, or to some other integrated circuit.

A particularly short conductor route between the components on the base and the integrated circuit or the sections thereof for which they are intended is of enormous importance particularly for the processing or production of radio-frequency signals and/or for high integrated circuit operating speeds. Specifically, the charge flow from and to the components at radio frequencies is limited by the reactance COL. of the connecting conductor, and this can be surprisingly high, even with relatively short connecting conductors. The reactance is 6.3 Ω/mm even for a piece of conductor with a normal self-inductance L of about 1 nH/mm and at a frequency of 1 GHz (frequencies on this order of magnitude are used, for example, in GSM mobile radio telephones). It can easily be seen from this high reactance that the components disposed on the base 2 can produce their optimum specified effect only if the connecting run to the integrated circuit is as short as possible. Irrespective of this, the effect of the components which are provided on the base or anywhere else in the IC module is considerably better due to their proximity to the integrated circuit than if they were provided outside the IC module, as in the past.

It has been found to be advantageous for entire capacitor areas to be formed on the base 2. This allows any desired sections of the integrated circuit to be connected to any desired number of capacitors by a very short run.

The capacitors in capacitor areas are preferably formed in such a way that at least some of them have a common substrate electrode or a common cover electrode. This allows the substrate electrode or cover electrode, which then forms a virtually complete layer, to be used at the same time as an electromagnetic shield for the integrated circuit.

In addition or alternatively, other passive components or structures such as resistors, inductors, wiring conductors or entire wiring planes, etc. can also be accommodated on the base, in addition to the capacitors, in a simple and space-saving manner. Since such components can be produced in a planar manner or in a plurality of layers on only a single side of the base, that is to say without any through-plating to the other side, the other side of the base can be metallized over a large area, and used as a shielding electrode.

Relatively complex passive and active components, that is to say even, for example, surface acoustic wave filters, sensors, transistors, and diodes, for example for transmitting and receiving optical signals or radio-frequency signals etc., may thus also be located, among other items, in the IC module.

Due to the flexibility associated with this, it has been found to be highly advantageous that, in principle, all of the procedures and methods known from thin-film or thick-film technology can be used. These procedures and methods start, for example, from the application of structures which represent conductors, resistor layers or components, such as spiral or meandering conductors in order to produce inductors, and extend to the use of lasers to trim resistors or to cut through connections. Even high-precision components or assemblies such as high-precision resistors, RC elements, filters, tuned circuits, etc. can thus easily be produced. If such structures are assembled skillfully on the base, they can be produced or interleaved as required in various ways by subsequently cutting conductors.

The base of the components may be bonded on to the integrated circuit and connected to it, or to a multichip module substrate located underneath it, using gold wire through the use of wire bonding. Then, as is shown in FIG. 1, a bond ball is preferably placed on a bond pad on the integrated circuit (if required on to a bond pad on the multichip module substrate that is located even deeper in the case of multichip modules), and a bond wedge can be placed on a bond pad on the base. This allows the bonding wire to meet the bond pad on the base relatively flat. If the integrated circuit and base are connected in such a way, the IC module does not become any thicker, or does not become significantly thicker in any case, when the base is fitted into the module. The bonded connections which need to be provided in the IC module even without the base, specifically occupy a not-inconsiderable free space upward in any case and this free space is not extended, or is scarcely extended, by the base and the bonding wires which need to run to it.

The formation of the components located in the IC module on a base, and the process of bonding them on to the integrated circuit in the IC module, represent a procedure to which there are no equivalent or better alternatives with regard to efficiency, flexibility, effectiveness and costs, based on the present level of knowledge.

It is equally the case that this type of component integration is not the only possible variant. For example, it is unnecessary to bond the base on to the integrated circuit. It can also be connected to the integrated circuit in any desired manner at any other points on the integrated circuit. Furthermore, it is not absolutely essential for the base to be bonded, or connected in some other way, to the integrated circuit at all. The base furthermore need not be disposed above the integrated circuit but can, in principle, occupy any desired relative position with respect to the integrated circuit. In other words, for example, it can even be disposed underneath it or alongside it. Furthermore, it need not be constructed in the form of a platelet but can assume any other shapes (for example that of a cylinder). It may also be as thick or thin as desired. The base may even be dispensed with. Specifically, with an appropriate configuration, the components to be located in the IC module may also be accommodated there in some other way. One of the options for this is to connect a conventional component, or a component specifically manufactured for this purpose, to corresponding fingers of the lead frame of the IC module, for example by soldering.

Finally, and in summary, it can be stated that, by moving components which are normally provided outside the IC module into it, it is feasible in a surprisingly simple manner to improve the function and method of operation of known IC modules in such a way that they can be used without any problems even at very high signal frequencies and operating speeds.

I claim:

1. An IC module, comprising:

at least one integrated circuit;

a base in the form of a platelet disposed on said at least one integrated circuit, said base having a capacitor area and formed of a material selected from the group consisting of glass and ceramic;

capacitors carried by said base at said capacitor area, at least some of said capacitors in said capacitor area having a common cover electrode; and a package jointly surrounding said capacitors and said base.

2. The IC module according to claim 1, wherein said capacitors are produced as co-fired ceramic and are formed on said base.

3. The IC module according to claim 1, wherein at least some of said capacitors in said capacitor area have a common substrate electrode.

4. The IC module according to claim 1, wherein said base is bonded to said integrated circuit.

5. The IC module according to claim 4, including bond pads disposed on said base, said capacitors being disposed on said base and connected to said integrated circuit by said bond pads.

6. The IC module according to claim 5, wherein said base has an edge at which said bond pads are disposed.

7. The IC module according to claim 6, wherein said bond lads have a surface, and including bonding wires connected to said bond pads at a substantially flat angle relative to said surface.

* * * * *